(12) United States Patent
Sander et al.

(10) Patent No.: US 8,169,224 B2
(45) Date of Patent: May 1, 2012

(54) POWER SWITCH WITH AN OVERCURRENT PROTECTION DEVICE

(75) Inventors: Rainald Sander, Munich (DE); Steffen Thiele, Munich (DE); Markus Winkler, Munich (DE)

(73) Assignee: Infineon Technologies Austria AG, Villach (AT)

( * ) Notice: Subject to any disclaimer, the term of this patent is extended or adjusted under 35 U.S.C. 154(b) by 465 days.

(21) Appl. No.: 12/499,611

(22) Filed: Jul. 8, 2009

(65) Prior Publication Data

US 2010/0007328 A1     Jan. 14, 2010

(30) Foreign Application Priority Data

Jul. 10, 2008   (DE) .......................... 10 2008 032 556

(51) Int. Cl.
  *G01R 31/08* (2006.01)
  *G01R 19/00* (2006.01)
  *G05F 3/16* (2006.01)
(52) U.S. Cl. .................... 324/522; 324/76.11; 323/316; 323/315
(58) Field of Classification Search ............... 324/76.11, 324/713, 522, 123 R, 126, 691, 649, 600; 323/316, 315, 312, 311, 304; 702/1, 57, 702/64
See application file for complete search history.

(56) References Cited

U.S. PATENT DOCUMENTS

| | | | |
|---|---|---|---|
| 4,885,477 A | 12/1989 | Bird et al. | |
| 6,057,728 A * | 5/2000 | Igarashi | 327/546 |
| 6,737,856 B2 * | 5/2004 | Sander | 324/762.09 |
| 7,009,403 B2 * | 3/2006 | Graf et al. | 324/522 |
| 7,126,354 B2 * | 10/2006 | Deboy et al. | 324/713 |

FOREIGN PATENT DOCUMENTS

| | | |
|---|---|---|
| DE | 10258766 | 7/2004 |
| EP | 1191693 | 3/2002 |

* cited by examiner

*Primary Examiner* — Hoai-An D Nguyen
(74) *Attorney, Agent, or Firm* — Patterson Thuente Christensen Pedersen, P.A.

(57) ABSTRACT

A power circuit includes a power transistor for feeding a load current to a load, a measuring transistor for coupling out a measurement current dependent on the load current, at least two coupling transistors for dividing the measurement current into an internal measurement current and into an external measurement current, wherein the external measurement current can be fed to an external evaluation circuit, and the internal measurement current is fed to an internal evaluation circuit for evaluation. A third coupling transistor can be coupled to the measuring transistor if a measuring device determines a non-coupled state, and the third coupling transistor can be decoupled from the measuring transistor if the measuring device determines a coupled state. The measuring device determines the coupled state if the external evaluation device is coupled to the power circuit, and the measuring device determines a non-coupled state if the external evaluation device is not coupled to the power circuit.

11 Claims, 4 Drawing Sheets

POWER SWITCH WITH AN OVERCURRENT PROTECTION DEVICE

RELATED APPLICATION

This application claims priority to German Patent Application No. 10 2008 032556, filed Jul. 10, 2008, which is incorporated herein by reference in its entirety.

TECHNICAL FIELD

The invention relates to a power switch for feeding a load current to a load.

BACKGROUND

Some power switches have separate outputs through which a measurement current proportional to the load current is passed outward, which enable a user to determine the load current through the power transistor in a simple manner. The user thus has the possibility of using this information about the magnitude of the current to regulate the power switch. The user likewise has the possibility of carrying out diagnoses about the load with the aid of this information. By way of example, this information can be used to ascertain what the state of an incandescent bulb is, in order for example to notify an automobile driver that an incandescent lamp must be replaced in the near future. The power switch per se should also be reliably protected against destruction, however. By way of example, an integrated temperature sensor can regulate the power switch in such a way that the maximum permissible temperature of the power switch per se is not exceeded.

One known solution for passing a measurement current of a power semiconductor arrangement outward is shown in FIG. 2 of U.S. Pat. No. 4,885,477. The arrangement exhibits a large and a small transistor, wherein the current of the small transistor is fed to a current measuring arrangement with the aid of a PMOS transistor and a differential amplifier.

A further known possibility for passing a measurement current of a power semiconductor arrangement outward is shown in EP 1 191 693. This circuit arrangement has a switch that connects a current sensing transistor to a first or second evaluation circuit depending on a control signal.

A further known possibility for passing a measurement current of a power semiconductor arrangement outward is shown in DE 10 258 766. The latter shows a circuit arrangement with range switching for increasing the absolute magnitude of the signal at a measuring resistor, in order to increase the resolution of an analog-to-digital converter. The circuit arrangement has at least two auxiliary transistors, the signal of which is dependent on the load current, and a switching means, which connects the load paths of the auxiliary transistors individually or as a plurality in parallel.

Measuring transistors have the task of mapping as accurately as possible the current flowing through the main transistor with a specific divider ratio. In the case of an arrangement with NMOS transistors as main and measuring transistors, a differential amplifier in combination with a PMOS transistor adapts the gate-source voltage of the two transistors, which should be of the same transistor type, to one another, such that both are operated with the same current density. Local temperature, matching and other influences are not taken into account with such devices and impair the accuracy of the measurement. Measuring transistors that are therefore positioned within the main transistor considerably increase the area requirement.

SUMMARY

Therefore, embodiments of the invention provide a power switch which is designed to provide an internal measurement current and an external measurement current and at the same time to minimize the area requirement of the measuring transistor, without the accuracy of the currents being impaired.

An embodiment of the power circuit comprises a power transistor for feeding a load current to a load, a measuring transistor for coupling out a measurement current dependent on the load current, at least two coupling transistors for dividing the measurement current into an internal measurement current and into an external measurement current, wherein the external measurement current can be fed to an external evaluation circuit, and the internal measurement current is fed to an internal evaluation circuit for evaluation.

BRIEF DESCRIPTION OF THE DRAWINGS

Embodiments are explained in more detail below with reference to the following drawings, in which.

DETAILED DESCRIPTION

Figure 1:
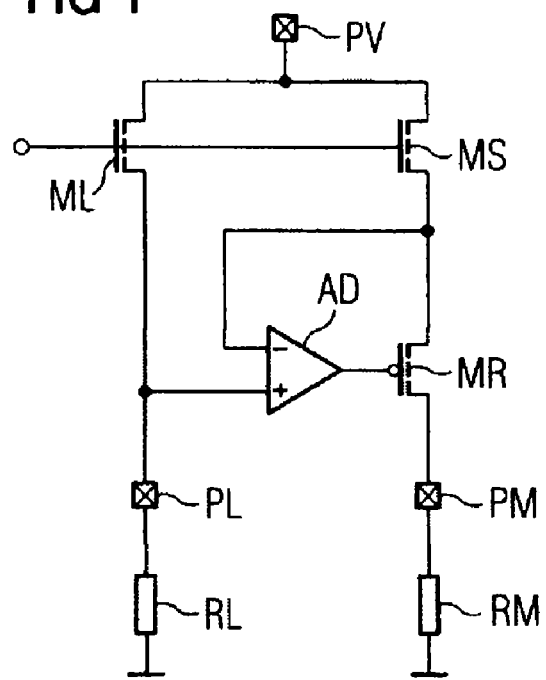
FIG. 1 depicts an embodiment of a high-side switch arrangement with a load transistor.

An embodiment of the power circuit comprises a power transistor for feeding a load current to a load, a measuring transistor for coupling out a measurement current dependent on the load current, at least two coupling transistors for dividing the measurement current into an internal measurement current and into an external measurement current, wherein the external measurement current can be fed to an external evaluation circuit, and the internal measurement current is fed to an internal evaluation circuit for evaluation.

When using sense cells as measuring transistors, replicas of the power transistor, it is possible to realize a current threshold, e.g. for protecting the power circuit, with sufficient accuracy. For a simple solution, however, at least one further sense cell is required as measuring transistor. This goes against the required minimization of the total area.

The power switch can be embodied as a high-side switch or as a low-side switch. The load transistor can be embodied as an NMOS or PMOS transistor. The load transistor can be embodied as a vertical transistor whose drain can be connected on the rear side of the semiconductor. A circuit topology of an NMOS high-side switch can be converted into a PMOS low-side switch by mirroring and by replacing the NMOS transistors by PMOS transistors and vice versa. A circuit topology of a PMOS high-side switch can be converted into an NMOS low-side switch by mirroring and by replacing the NMOS transistors by PMOS transistors, and vice versa. In one embodiment of a PMOS high-side switch, a regulating circuit can have a circuit for mirroring the measurement current.

If the power transistor already contains a sense cell element, that is to say a measuring transistor, for example for outputting an equivalent to the load current, then said sense cell element can also be used for determining an excessively high load current.

The power circuit can have a regulating circuit for regulating the measuring transistor, such that the measuring transistor is operated with the same current density as the power transistor.

In the power circuit embodied as a high-side arrangement with power NMOS transistors, the coupling transistors can be embodied as PMOS transistors whose source terminals are connected to one another and whose gate terminals are connected to one another.

In the power circuit, a first load terminal of the power transistor can be connected to a first load terminal of the measuring transistor, wherein a gate terminal of the power transistor is connected to a gate terminal of the measuring transistor.

In the power circuit, an output of the regulating circuit can be connected to the gate terminals of the coupling transistors, a first input of the regulating circuit can be connected to a second load terminal of the power transistor, and a second input of the regulating circuit can be connected to a second load terminal of the measuring transistor.

In the power circuit, the ratio of the external measurement current to the internal measurement current can be determined by the ratio of the channel widths of the coupling transistors.

The power transistor and the measuring transistor are operated at the same operating point by the regulating circuit in interaction with the coupling transistors, for which reason the current densities in the power transistor and in the measuring transistor are identical. If an external evaluation circuit is connected to the power circuit, the external measurement current can flow. If the coupling transistors have the same channel length, which is advantageous for matching, the ratio of the external measurement current to the internal measurement current is determined by the ratio of the channel widths of the coupling transistors.

The ratio of measurement current to load current can be specified by the factor n/m, where m denotes the cell number or the channel width of the power transistor and where n denotes the cell number or the channel width of the measuring transistor. k denotes the total channel width of the active coupling transistors and l denotes the channel width of the coupling transistor which feeds the external measurement current to an external evaluation circuit. The external measurement current Ime thus has the following relationship with the load current Il:

$$Ime = \frac{n}{m}\frac{l}{k}Il$$

The internal measurement current Imi thus has the following relationship with the load current:

$$Imi = \frac{n}{m}\left(1 - \frac{l}{k}\right)Il$$

The power circuit can have a first coupling transistor for conducting the external measurement current, a second coupling transistor for conducting the internal measurement current, a third coupling transistor and a measuring device for determining the coupled nature of the external evaluation device. The third coupling transistor is coupled to the measuring transistor if the measuring device determines a non-coupled state, and the third coupling transistor is decoupled from the measuring transistor if the measuring device determines a coupled state. The measuring device determines the coupled state if the external evaluation device is coupled to the power circuit, and the measuring device determines a non-coupled state if the external evaluation device is not coupled to the power circuit.

If no external evaluation circuit is coupled to the power circuit, no external measurement current can flow. The entire current of the measuring transistor thus has to flow via the second coupling transistor. The internal measurement current is thus greater than intended by the factor k/l. An evaluation of the internal measurement current therefore leads to incorrect results. This can be avoided by the current being conducted away by another transistor. A measuring device checks whether an external evaluation device is present. If this external evaluation device is not present or the check reveals that a possibly coupled external measuring device at least behaves as if it were not connected, the third coupling transistor is coupled to the measuring transistor in order that the current provided for the external evaluation device flows through this transistor.

The measuring device of the power circuit can determine the coupled state by the measuring device measuring the voltage at a drain terminal of the first coupling transistor. The measuring device determines the coupled state if the voltage falls below a threshold, and determines the non-coupled state if the voltage exceeds a threshold.

If, by way of example, the external evaluation circuit is a resistor whose voltage can be evaluated by an analog-to-digital converter, for example, then a high voltage drop results at the external terminal of the first coupling transistor, or the drain-source voltage of the first coupling transistor becomes minimal. This is an indication that the external evaluation device is not correctly connected or exhibits an incorrect behavior.

The measuring device of the power circuit can determine the coupled state by the measuring device measuring the current through the first coupling transistor. The measuring device determines the coupled state if the current exceeds a threshold, and determines the non-coupled state if the current falls below a threshold.

This type of evaluation has the advantage of directly checking whether or not the first coupling transistor conducts the current. If the first coupling transistor can no longer conduct the intended current component k/l of the measurement current, the third coupling transistor is coupled to the measuring transistor for the purpose of conducting the current component k/l of the measurement current.

A series resistor can be coupled to a source terminal of the first coupling transistor of the power circuit, through which series resistor the current of the first coupling transistor can flow, such that the measuring device can measure the voltage caused by the current of the first coupling transistor. The measuring device determines the coupled state if the voltage exceeds a threshold, and determines the non-coupled state if the voltage falls below a threshold.

A series resistor in the current conduction path of a transistor is a simple and reliable possibility for measuring the current of a transistor.

The coupling transistors of the power circuit have source terminals, and series resistors can be coupled to at least two source terminals of the coupling transistors, through which series resistors the currents of the coupling transistors can flow.

The series resistors can advantageously be embodied such that identical voltages are dropped across the series resistors given identical current density in the coupling transistors.

If all the coupling transistors are provided with series resistors, the coupling transistors can again be configured such that the currents flowing through them are still determined by the channel widths of the coupling transistors.

The measuring device of the power circuit can compare the voltages at the series resistors of the first and of the second coupling transistor. If the voltage at the series resistor of the first coupling transistor is greater than or equal to the voltage at the series resistor of the second coupling transistor, the coupled state is determined. If the voltage at the series resistor of the first coupling transistor is less than the voltage at the series resistor of the second coupling transistor, the non-coupled state is determined.

It is advantageous here that the current of the coupling transistor is compared with a relative threshold. It is not necessary to provide an absolute threshold. The measuring device can be configured more simply, since now it only compares two voltages present with one another. The measuring device can be embodied for example as a differential amplifier that compares the voltages present with one another.

The measuring device of the power circuit can contain an offset voltage or an offset voltage can be fed to the measuring device. The measuring device determines the coupled state if the voltage at the series resistor of the first coupling transistor and the offset voltage are greater than or equal to the voltage at the series resistor of the second coupling transistor. The measuring device determines the non-coupled state if the voltage at the series resistor of the first coupling transistor and the offset voltage are less than the voltage at the series resistor of the second coupling transistor.

FIG. 1 shows a high-side switch arrangement with a load transistor ML. The load transistor ML is embodied as an NMOS transistor, the drain of which is connected to a terminal PV. A positive voltage is applied to the terminal PV. A load RL is connected to the source terminal of the load transistor ML via a terminal PL. If the transistor ML is driven, then it feeds a current to the load RL. In order to measure the current of the load transistor ML, a sense transistor MS is connected in parallel with the load transistor ML. The sense transistor MS is a transistor of the same type as the load transistor ML and should be arranged in the vicinity of the load transistor ML. The sense transistor MS is smaller than the load transistor ML, with the result that the current of the sense transistor MS is less than the current of the load transistor ML. In order that the sense transistor MS is operated with the same current density as the load transistor ML, both transistors should have the same gate-source voltage. The source voltage of the sense transistor MS is regulated by a differential amplifier AD and by a regulating transistor MR in such a way that the gate-source voltages of ML and MS are identical. For this purpose, the negative input of the differential amplifier AD is connected to the source of the sense transistor MS, and the positive input of the differential amplifier AD is connected to the source terminal of the load transistor ML. The output of the differential amplifier AD is connected to the gate terminal of the regulating transistor MR. If the voltage difference at the inputs of the differential amplifier AD is zero, the regulating transistor MR is driven in such a way that the source voltage of the load transistor ML and that of the sense transistor MS are identical, such that both transistors are operated with the same current density. Through the drain terminal of the regulating transistor MR, the current of the sense transistor MS can then be conducted to an external resistor RM. Since the current density of the load transistor ML and that of the sense transistor are identical, the current conducted through the drain of the regulating transistor MR to the resistor RM is directly proportional to the current that flows through the load transistor ML. This circuit topology of the NMOS high-side switch can be converted into a PMOS low-side switch by mirroring and by replacing the NMOS transistors by PMOS transistors, and vice versa.

Figure 2:
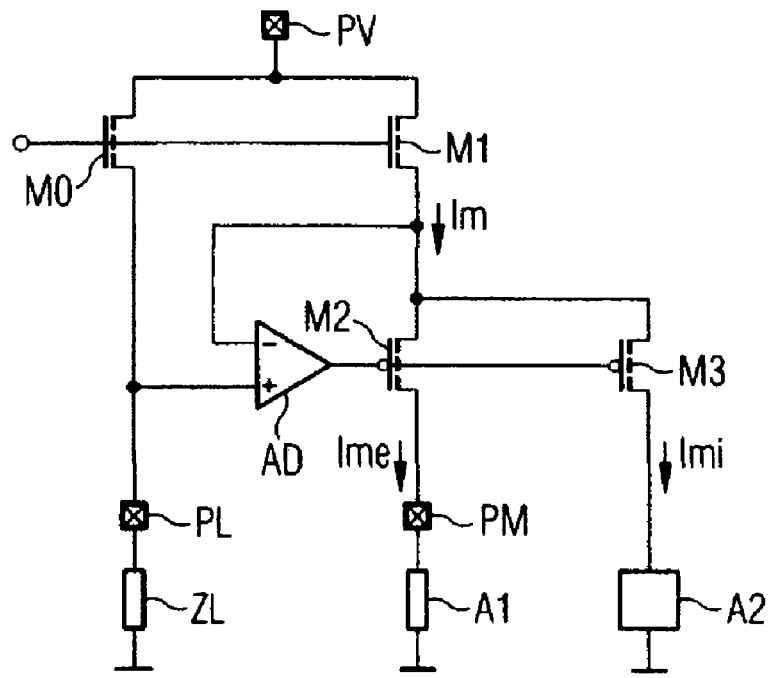
FIG. 2 depicts an exemplary embodiment of a power circuit as a high-side arrangement with an NMOS load transistor.

FIG. 2 shows an embodiment of a power circuit comprising a power transistor M0, a measuring transistor M1, two coupling transistors M2 and M3, a regulating circuit A0 and an internal evaluation circuit A2. In this exemplary embodiment, the power transistor M0 and the measuring transistor M1 are embodied as NMOS transistors, wherein the gate terminals of the two transistors and the drain terminals of the two transistors are connected to one another. The gate-source voltages of the power transistor M0 and of the measuring transistor M1 are regulated by the regulating circuit A0 and the coupling transistors M2 and M3 in such a way that they are identical. As a result, the power transistor M0 and the measuring transistor M1 have the same current density during operation. The measurement current Im, which flows from the source terminal of the measuring transistor M1 into the source terminals of the coupling transistors M2 and M3, is divided into an external measurement current Ime and into an internal measurement current Imi by the coupling transistors M2 and M3. The external measurement current Ime flows from the drain terminal of the coupling transistor M2 through a terminal PM into an external evaluation circuit A1. An external evaluation circuit A1 can comprise a resistor, for example, at which the external measurement current Ime is converted into a voltage that can be detected by an analog-to-digital converter, for example. The internal measurement current Imi, which flows from the drain terminal of the coupling transistor M3, is fed to an internal evaluation circuit A2. The internal evaluation circuit can be embodied as a resistor, for example, the voltage of which is monitored by means of a comparator. If the voltage of the resistor of the internal evaluation circuit A2 exceeds a threshold, for example the comparator of the internal evaluation circuit A2 can output a signal. Since this signal is dependent on the absolute current flowing in the power transistor M0, this signal can be used to indicate to a circuit that a maximum permissible current of the power transistor M0 has been exceeded. This signal can be used for example to turn off the power circuit, in order to protect it against destruction.

Figure 3:
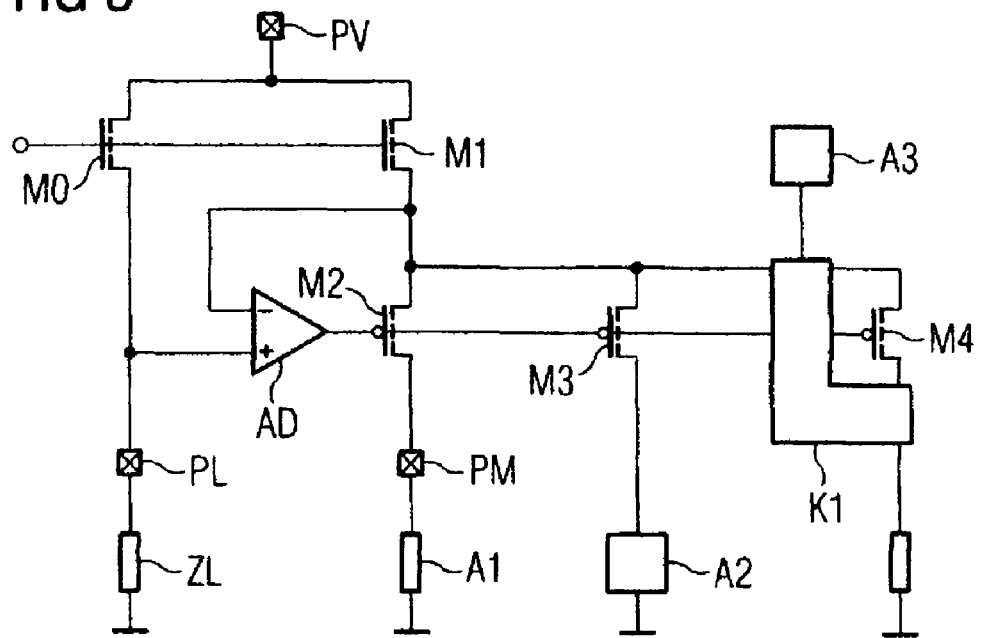
FIG. 3 depicts an exemplary embodiment with a coupling transistor that can be coupled.

FIG. 3 shows a power circuit comprising a power transistor M0, a measuring transistor M1, a regulating circuit A0, three coupling transistors M2, M3, M4 and a measuring device A3. The coupling transistor M4 is connected to the coupling transistors M2 and M3 via a coupling device K1. The coupling device K1 is configured such that it can couple the coupling transistor M4 to the coupling transistors M2 and M3 or can decouple the coupling transistor M4 from the coupling transistors M2 and M3. In the non-coupled state, the coupling transistor M4 is coupled to the coupling transistors M2 and M3 by the coupling device K1. In the coupled state, the coupling transistor M4 is decoupled from the coupling transistors M2 and M3 by the coupling device K1. A measuring device A3 checks the state of the first coupling transistor M2 or the state of the external measuring device A1. If an external measuring device A1 is connected to the first coupling transistor M2 via the terminal PM, or if a current flows through the first coupling transistor M2, the measuring device determines the coupled state. If the external evaluation device A1 is not connected to the first coupling transistor M2 via the terminal PM, or if no current flows through the first coupling transistor M2, the measuring device A3 determines the non-coupled state.

If an external evaluation device A1 is connected to the first coupling transistor M2, an external measurement current Ime flows through the first coupling transistor M2. The measurement current of the measuring transistor M1 is divided into an external and an internal measurement current by the two coupling transistors M2 and M3. If the external evaluation circuit A1 is not connected to the first coupling transistor M2, no current can flow through the first coupling transistor M2. In this case, the entire measurement current of the measuring transistor M1 flows through the second coupling transistor M3. The now excessively large internal measurement current would corrupt the result of an internal evaluation circuit. In this case, the measuring circuit A3 detects the error and determines the coupled state for the third coupling transistor M4. If the third coupling transistor M4 is configured just like the first coupling transistor M2, the current that was intended for the first coupling transistor now flows via the third coupling transistor M4. Since the external measurement current Ime intended for external evaluation circuit A1 now flows via the third coupling transistor M4, the correct internal measurement current Imi once again flows via the second coupling transistor M3. The internal evaluation circuit A2 is therefore no longer disturbed by the absence of the external evaluation circuit A1.

Figure 4:
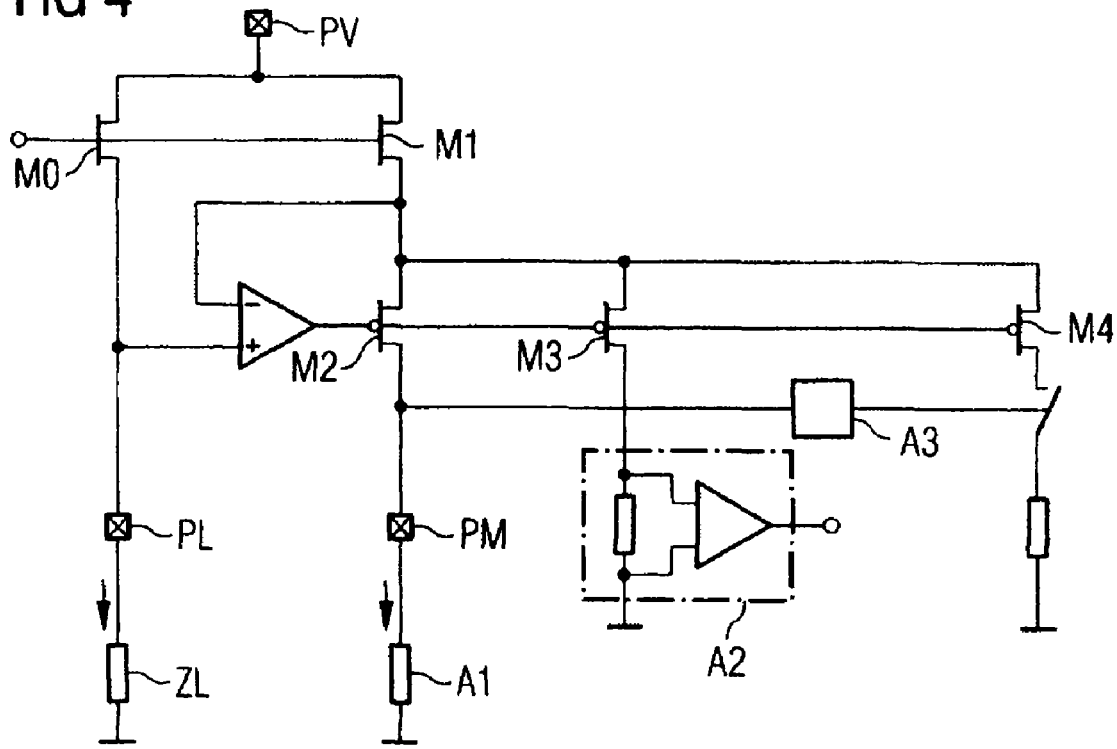
FIG. 4 depicts a further exemplary embodiment with a coupling transistor that can be coupled.

FIG. 4 shows an exemplary embodiment of a power circuit in a high-side configuration with three coupling transistors M2, M3, M4, wherein the measuring device A3 checks the voltage at the drain terminal of the first coupling transistor M2 and couples or decouples the third coupling transistor M4 from the coupling transistors in accordance with the drain voltage of the first coupling transistor M2.

In this exemplary embodiment, the internal evaluation circuit is embodied as a resistor with a comparator which can output a signal when a threshold is exceeded.

The measuring device A3, which checks the drain voltage of the first coupling transistor M2, can be embodied as a Schmitt trigger, for example. If a higher accuracy is required, the measuring device can be embodied as a comparator, for example, which compares the drain voltage of the first coupling transistor M2 with a reference voltage.

Figure 5:
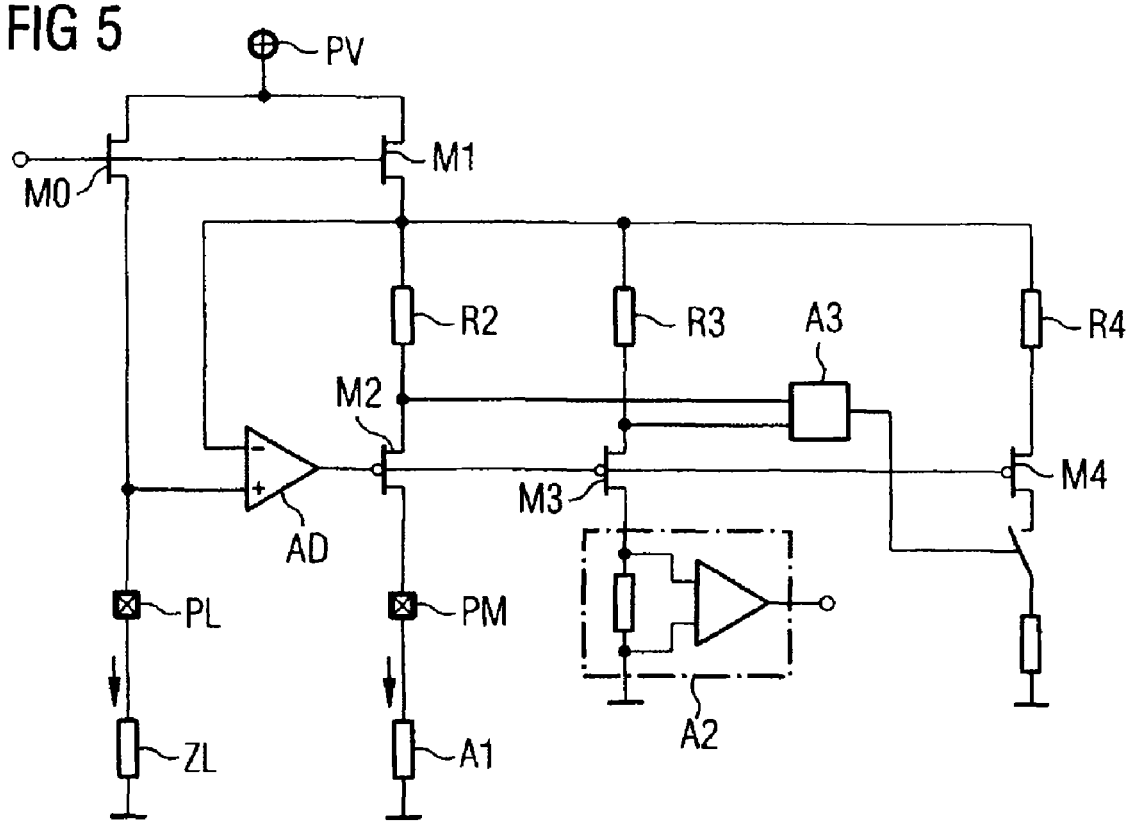
FIG. 5 depicts a further exemplary embodiment with a coupling transistor that can be coupled.

FIG. 5 shows a power circuit comprising a power transistor M0, a measuring transistor M1, three coupling transistors M2, M3, M4 and an evaluation device A3. The source terminals of the coupling transistors M2, M3 and M4 are connected by series resistors R2, R3, R4 to the source terminal of the measuring transistor M1. In this exemplary embodiment, the current of the first coupling transistor is monitored directly. The measuring device A3 checks the voltages at the series resistors R2 and R3. The measuring device A3 determines the coupled state if the voltage across the series resistor R2 is greater than or equal to the voltage across the series resistor R3. The measuring device A3 determines the non-coupled state if the voltage at the series resistor R2 is less than the voltage at the series resistor R3.

Figure 6:
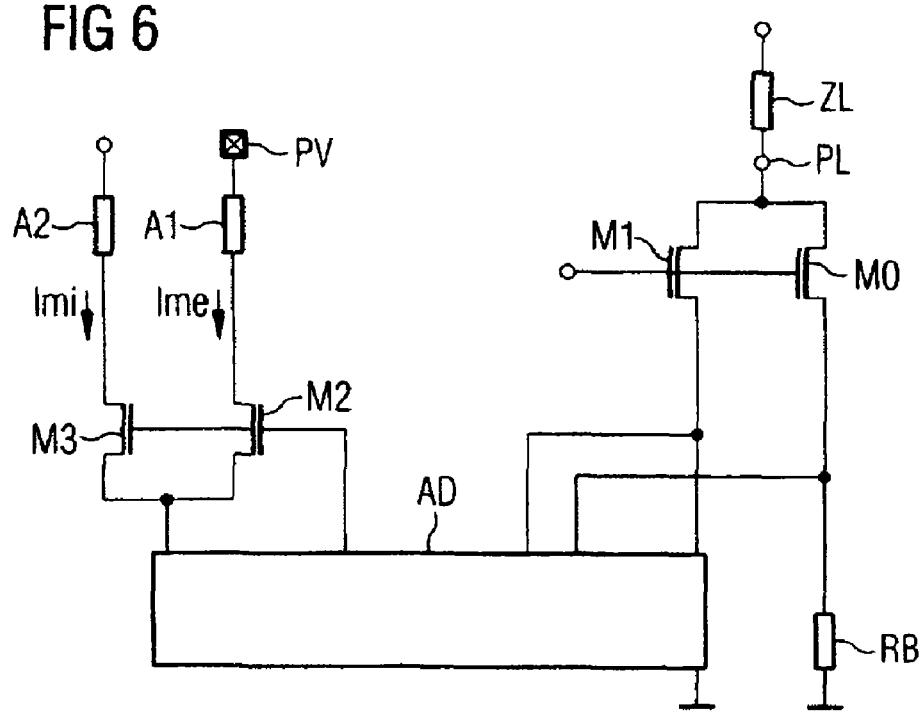
FIG. 6 depicts an exemplary embodiment of a power circuit as a low-side arrangement with an NMOS load transistor.

FIG. 6 shows a power circuit according to the invention in an NMOS low-side arrangement, comprising a power transistor M0, a measuring transistor M1, two coupling transistors M2 and M3, a regulating circuit A0 and an internal evaluation circuit A2. The source terminal of the power transistor M0 is connected to a supply potential via a source terminal resistor RB. In this exemplary embodiment, this resistor RB comprises the resistances of the bonding wire, the resistance of the feed to the bonding wire and the resistance of the housing. The gate terminals of the two transistors and the drain terminals of the two transistors are connected to one another. The gate-source voltages of the power transistor M0 and of the measuring transistor M1 are regulated by the regulating circuit A0 in such a way that they are identical. As a result, the power transistor M0 and the measuring transistor M1 have the same current density during operation. The measurement current Im, which flows from the source terminal of the measuring transistor M1 into the regulating circuit A0, is divided, after the measurement current Im has been mirrored by the regulating circuit, into an external measurement current Ime and into an internal measurement current Imi by the coupling transistors M2 and M3. The external measurement current Ime flows from the drain terminal of the coupling transistor M2 through a terminal PM into an external evaluation circuit A1. The internal measurement current Imi, which flows from the drain terminal of the coupling transistor M3, is fed to an internal evaluation circuit A2. This circuit topology of the NMOS low-side switch can be converted into a PMOS high-side switch by mirroring and by replacing the NMOS transistors by PMOS transistors, and vice versa.

Figure 7:
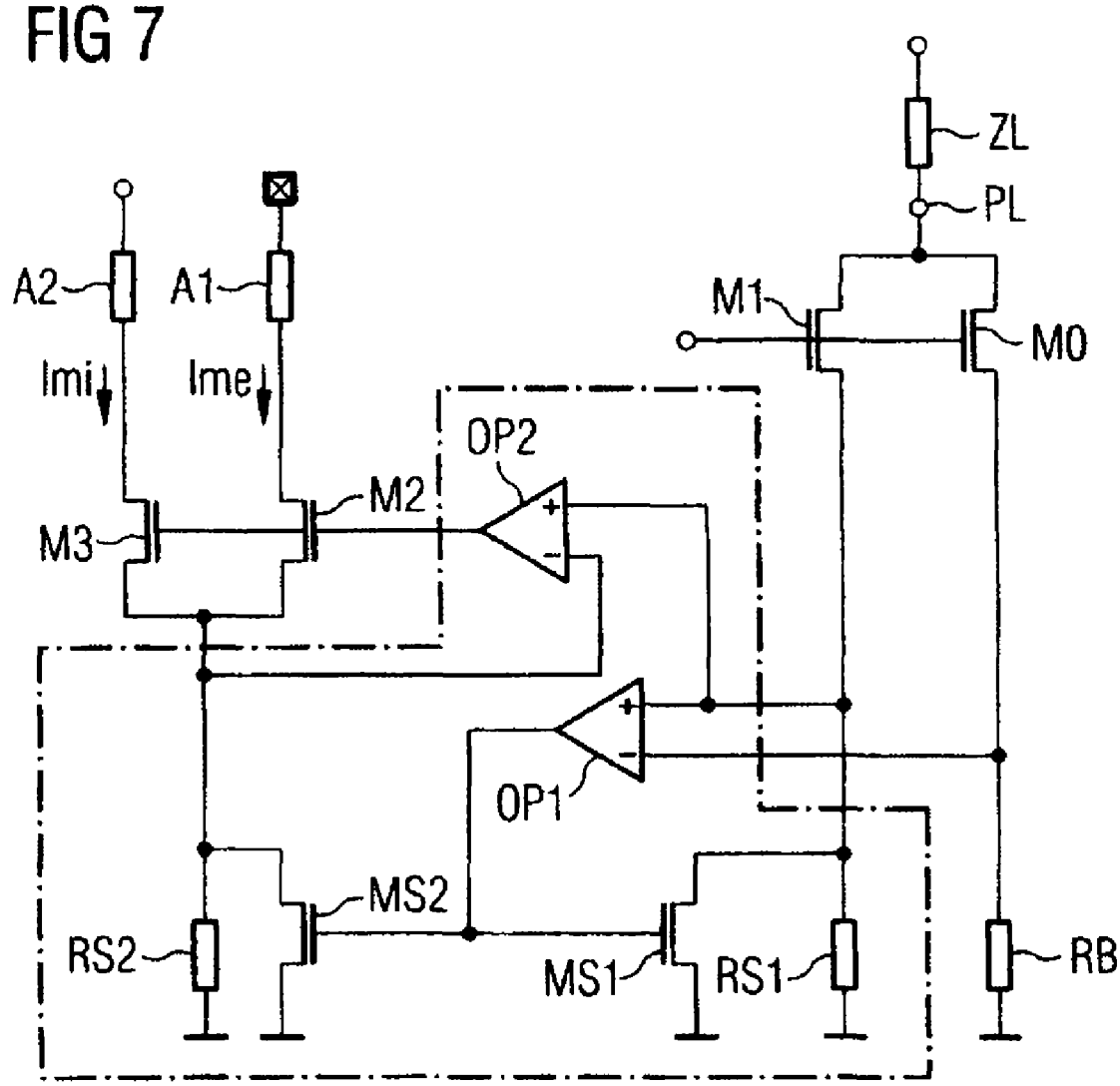
FIG. 7 depicts a further exemplary embodiment of a power circuit as a low-side arrangement with an NMOS load transistor.

FIG. 7 shows a power circuit according to the invention in an NMOS low-side arrangement, in which one possible embodiment of a regulating circuit A0 is explained in greater detail. The embodiments of the coupling transistors M2, M3, M4 and their interconnections which were explained by way of example in FIGS. 3-5 can be employed analogously here.

The regulating circuit A0 comprises a first resistor RS1 for connecting the source terminal of the measuring transistor M1 to a supply potential, a second resistor RS2, which is similar to the first resistor, a first transistor MS1, which is connected to the first resistor RS1 in such a way that the first transistor MS1 can conduct a current past the first transistor, a differential amplifier OP1, which is connected to the power transistor M0, the measuring transistor M1 and the first transistor MS1 in such a way that the differential amplifier OP1 can regulate the measuring transistor M1 in such a way that the measuring transistor has the same current density as the power transistor during operation. The regulating circuit A0 furthermore comprises a second resistor RS2 and a second transistor MS2, which are connected to the first resistor RS1 and the first transistor MS1 in such a way that a current which flows in an output of the second transistor is similar to that which flows into an output of the first transistor MS1, which can be connected to the source terminal of the measuring transistor. In order to improve the accuracy, the regulating circuit A0 can have a second differential amplifier OP2, which regulates the coupling transistors M2, M3 in such a way that the potential at the output of the first transistor MS1 is equal to the potential at the output of the second transistor MS2.

The first and second transistors MS1, MS2, the first and second resistors RS1, RS2 and the differential amplifier OP1 form a current mirror that is particularly suitable for mirroring a current at low drain-source voltages of the transistors. The first resistor RS1 can advantageously be chosen such that the voltage across this resistor RS1 is greater than the voltage across the terminal resistor RB of the first transistor MS1 without the first resistor RS1 and the effect of the first transistor is thus absent. The resistors RS1, RS2 can advantageously be chosen in such a way that they are as similar to one another as possible, that is to say that they match well. The accuracy is improved by reducing the influence of the output resistance of the first and of the second transistor MS1, MS2. This can be achieved by the voltages at the outputs of the first and of the second transistor being as far as possible identical.

This can be achieved for example by the second differential amplifier OP2 correspondingly regulating the coupling transistors M2, M3.

The invention claimed is:

1. A power circuit comprising:
   a power transistor configured to feed a load current to a load;
   a measuring transistor for coupling out a measurement current dependent on the load current;
   at least two coupling transistors for dividing the measurement current into an internal measurement current and an external measurement current, wherein the external measurement current can be fed to an external evaluation circuit, and the internal measurement current is fed to an internal evaluation circuit for evaluation, wherein the at least two coupling transistors comprise a first coupling transistor configured to conduct the external measurement current, a second coupling transistor configured to conduct the internal measurement current, a third coupling transistor and a measuring device configured to determine a coupled nature of the external evaluation circuit to the power circuit, wherein the third coupling transistor is coupled to the measuring transistor if the measuring device determines a non-coupled state in which the external evaluation circuit is not coupled to the power circuit, and wherein the third coupling transistor is decoupled from the measuring transistor if the measuring device determines a coupled state in which the external evaluation circuit is coupled to the power circuit.

2. The power circuit of claim 1, comprising a regulating circuit for regulating the measuring transistor, such that the measuring transistor is operated with the same current density as the power transistor.

3. The power circuit as claimed in any of the preceding claims, wherein a first load terminal of the power transistor (M0) is connected to a first load terminal of the measuring transistor (M1) and wherein a gate terminal of the power transistor (M0) is connected to a gate terminal of the measuring transistor (M1).

4. The power circuit of claim 2, wherein an output of the regulating circuit is connected to gate terminals of the coupling transistors, wherein a first input of the regulating circuit is connected to a second load terminal of the power transistor, and wherein a second input of the regulating circuit is connected to a second load terminal of the measuring transistor.

5. The power circuit of claim 1, wherein a ratio of the external measurement current to the internal measurement current is determined by a ratio of channel widths of the coupling transistors.

6. The power circuit of claim 1, wherein the measuring device determines the coupled state by measuring a voltage at a drain terminal of the first coupling transistor, wherein the measuring device determines the coupled state if the voltage falls below a threshold, and wherein the measuring device determines the non-coupled state if the voltage exceeds the threshold.

7. The power circuit of claim 1, wherein the measuring device determines the coupled state by measuring a current through the first coupling transistor, wherein the measuring device determines the coupled state if the current exceeds a threshold, and wherein the measuring device determines the non-coupled state if the current falls below the threshold.

8. The power circuit of claim 7, wherein a series resistor is coupled to a source terminal of the first coupling transistor, through which series resistor the current of the first coupling transistor can flow, wherein the measuring device is configured to measure a voltage caused by the current of the first coupling transistor at the series resistor, wherein the measuring device determines the coupled state if the voltage exceeds a threshold, and wherein the measuring device determines the non-coupled state if the voltage falls below the threshold.

9. The power circuit of claim 8, wherein the coupling transistors have source terminals, and wherein a respective series resistor is coupled to at least two source terminals of the coupling transistors, through which series resistors a current of the respective coupling transistor can flow, wherein at least two of the series resistors are embodied such that identical voltages drop across the at least two series resistors given identical current density in the respective coupling transistors.

10. The power circuit of claim 9, wherein the measuring device is configured to compare voltages at the at least two series resistors of the first and second coupling transistors, and wherein the measuring device is configured to determine the coupled state if a voltage at the series resistor of the first coupling transistor is greater than or equal to a voltage at the series resistor of the second coupling transistor, and the measuring device is configured to determine the non-coupled state if a voltage at the series resistor of the first coupling transistor is less than the voltage at the series resistor of the second coupling transistor.

11. The power circuit of claim 10, wherein an offset voltage is associated with the measuring device, wherein the measuring device determines the coupled state if the voltage at the series resistor of the first coupling transistor and the offset voltage are greater than or equal to the voltage at the series resistor of the second coupling transistor, and the measuring device determines the non-coupled state if the voltage at the series resistor of the first coupling transistor and the offset voltage are less than the voltage at the series resistor of the second coupling transistor.

* * * * *